(12) United States Patent
Copperthite et al.

(10) Patent No.: US 12,070,814 B2
(45) Date of Patent: Aug. 27, 2024

(54) ULTRASONIC WELDING SYSTEMS, METHODS OF USING THE SAME, AND RELATED WORKPIECES INCLUDING WELDED CONDUCTIVE PINS

(71) Applicant: Kulicke and Soffa Industries, Inc., Fort Washington, PA (US)

(72) Inventors: Theodore J. Copperthite, Laguna Hills, CA (US); Richard J. McCartney, Jr., Chandler, AZ (US); Omid Niayesh, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 18/510,842

(22) Filed: Nov. 16, 2023

(65) Prior Publication Data

US 2024/0091876 A1 Mar. 21, 2024

Related U.S. Application Data

(63) Continuation of application No. 17/333,875, filed on May 28, 2021, now Pat. No. 11,850,676.

(51) Int. Cl.
*B23K 20/00* (2006.01)
*B23K 20/10* (2006.01)
(Continued)

(52) U.S. Cl.
CPC ............ *B23K 20/10* (2013.01); *B23K 20/002* (2013.01); *B23K 37/04* (2013.01); *H05K 3/328* (2013.01);
(Continued)

(58) Field of Classification Search
CPC ....... B23K 20/10–1215; B23K 20/1285–1295; B23K 20/002;
(Continued)

(56) References Cited

U.S. PATENT DOCUMENTS

| 3,464,102 | A | * | 9/1969 | Soloff | ..................... B29C 65/08 156/580.2 |
| 4,529,115 | A | | 7/1985 | Renshaw et al. | |

(Continued)

FOREIGN PATENT DOCUMENTS

| CA | 2294553 A1 | * | 7/2000 | ............. B23K 20/10 |
| CN | 101754591 A | * | 6/2010 | ........... B23K 20/106 |

(Continued)

OTHER PUBLICATIONS

International Search Report completed Aug. 31, 2021 for International Patent Application No. PCT/US2021/034847.
(Continued)

*Primary Examiner* — Kiley S Stoner
(74) *Attorney, Agent, or Firm* — Christopher M. Spletzer, Sr.

(57) ABSTRACT

An ultrasonic welding system is provided. The ultrasonic welding system includes a support structure for supporting a workpiece. The ultrasonic welding system also includes a weld head assembly including an ultrasonic converter carrying a sonotrode. The ultrasonic welding system also includes a conductive pin supply configured to provide a plurality of conductive pins for welding using the sonotrode.

16 Claims, 10 Drawing Sheets

Related U.S. Application Data

(60) Provisional application No. 63/034,345, filed on Jun. 3, 2020.

(51) Int. Cl.
*B23K 37/04* (2006.01)
*H05K 3/32* (2006.01)
*B23K 101/40* (2006.01)
*B23K 101/42* (2006.01)
*H01L 23/49* (2006.01)

(52) U.S. Cl.
CPC ...... *B23K 2101/40* (2018.08); *B23K 2101/42* (2018.08); *H01L 23/49* (2013.01); *H05K 2203/0285* (2013.01)

(58) Field of Classification Search
CPC ........ B23K 37/04–053; B23K 2101/40; B23K 2101/42; B23K 9/20–207; B23K 1/0016; B23K 1/206; H05K 3/328; H05K 2203/0285; H01L 23/49
USPC .............. 228/6.1–6.2, 44.3–44.7, 47.1–49.6, 228/212–213, 112.1–114.5; 219/98–99
See application file for complete search history.

(56) References Cited

U.S. PATENT DOCUMENTS

| | | | |
|---|---|---|---|
| 5,292,054 A * | 3/1994 | Leeb | H01L 21/4882 228/183 |
| 5,655,700 A * | 8/1997 | Pham | B23K 20/106 257/E21.511 |
| 5,669,545 A * | 9/1997 | Pham | B23K 20/10 257/E21.511 |
| 7,629,231 B2 * | 12/2009 | Maki | H01L 24/83 438/464 |
| 7,986,034 B2 | 7/2011 | Kemper et al. | |
| 8,563,364 B2 | 10/2013 | Stolze et al. | |
| 10,882,134 B2 | 1/2021 | Luechinger et al. | |
| 2002/0066767 A1 * | 6/2002 | Takahashi | H01L 24/75 228/110.1 |
| 2003/0047583 A1 * | 3/2003 | Kyomasu | B06B 3/00 228/110.1 |
| 2003/0062110 A1 * | 4/2003 | Urlaub | B06B 3/02 156/73.1 |
| 2004/0144834 A1 * | 7/2004 | Nomoto | H05K 3/3478 228/180.1 |
| 2006/0037997 A1 | 2/2006 | Higashi et al. | |
| 2007/0056934 A1 * | 3/2007 | Hsu | B23K 9/201 219/98 |
| 2010/0269333 A1 * | 10/2010 | Masumoto | H05K 3/328 29/832 |
| 2012/0097339 A1 | 4/2012 | Hull | |
| 2013/0240152 A1 * | 9/2013 | Regan | B23K 20/106 228/1.1 |
| 2015/0306701 A1 | 10/2015 | Tauscher et al. | |
| 2015/0336329 A1 | 11/2015 | Lehmann et al. | |
| 2017/0057155 A1 | 3/2017 | Barnes et al. | |
| 2020/0164460 A1 | 5/2020 | Copperthite et al. | |

FOREIGN PATENT DOCUMENTS

| | | | | |
|---|---|---|---|---|
| DE | 19530324 C1 * | 12/1996 | | B23K 9/202 |
| EP | 1000732 A2 * | 5/2000 | | B29C 65/08 |
| EP | 2927940 | 10/2015 | | |
| EP | 1927132 | 7/2018 | | |
| EP | 3982401 A1 * | 4/2022 | | H01L 23/053 |
| JP | 2000504638 A * | 4/2000 | | |
| JP | 4338834 B2 * | 10/2009 | | B23K 20/10 |
| KR | 10-2015-0087232 A | 7/2015 | | |
| WO | WO-2011120726 A1 * | 10/2011 | | B23K 11/0053 |
| WO | WO-2014080195 A1 * | 5/2014 | | B21J 15/00 |

OTHER PUBLICATIONS

European Search Report completed May 3, 2024 for European Patent Application No. EP 21817544.

* cited by examiner

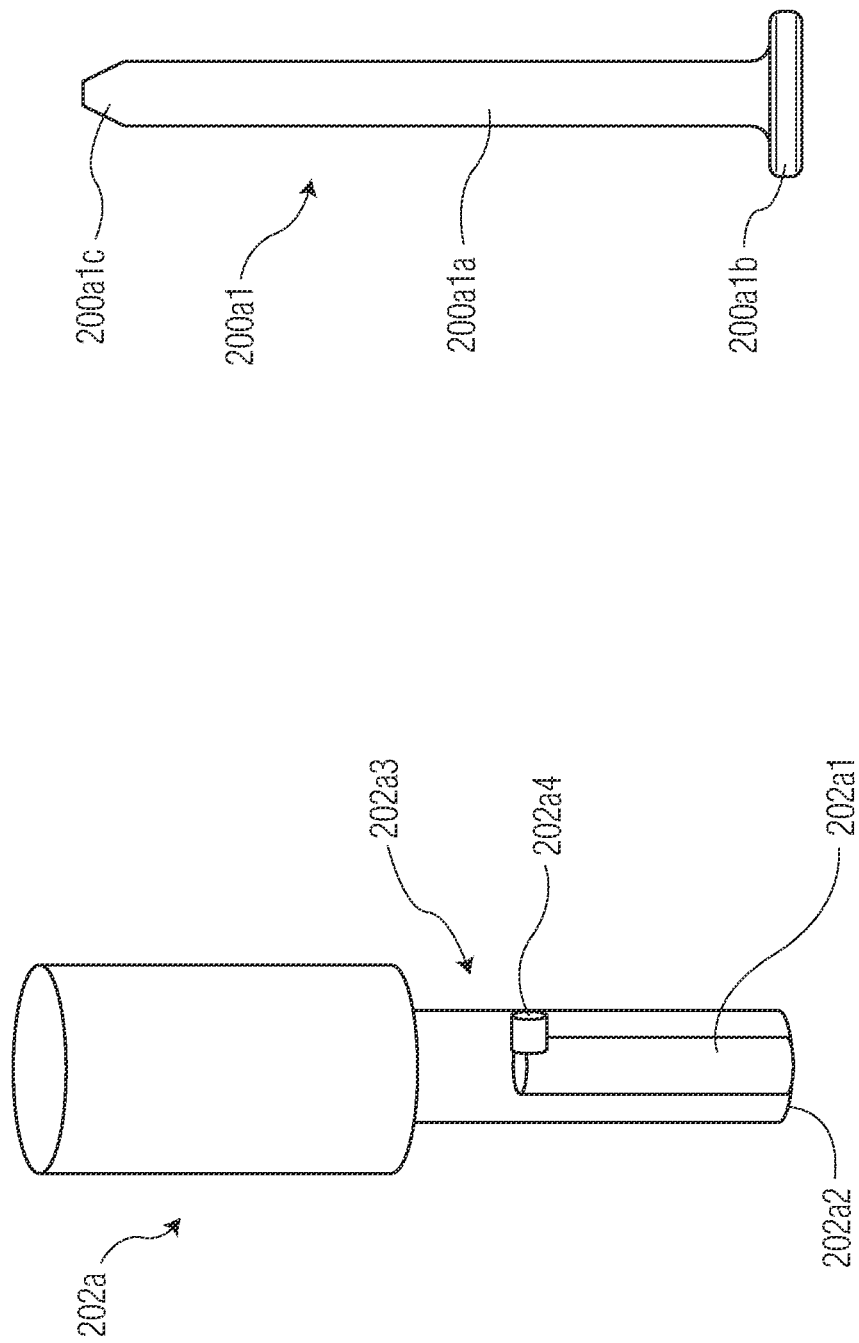

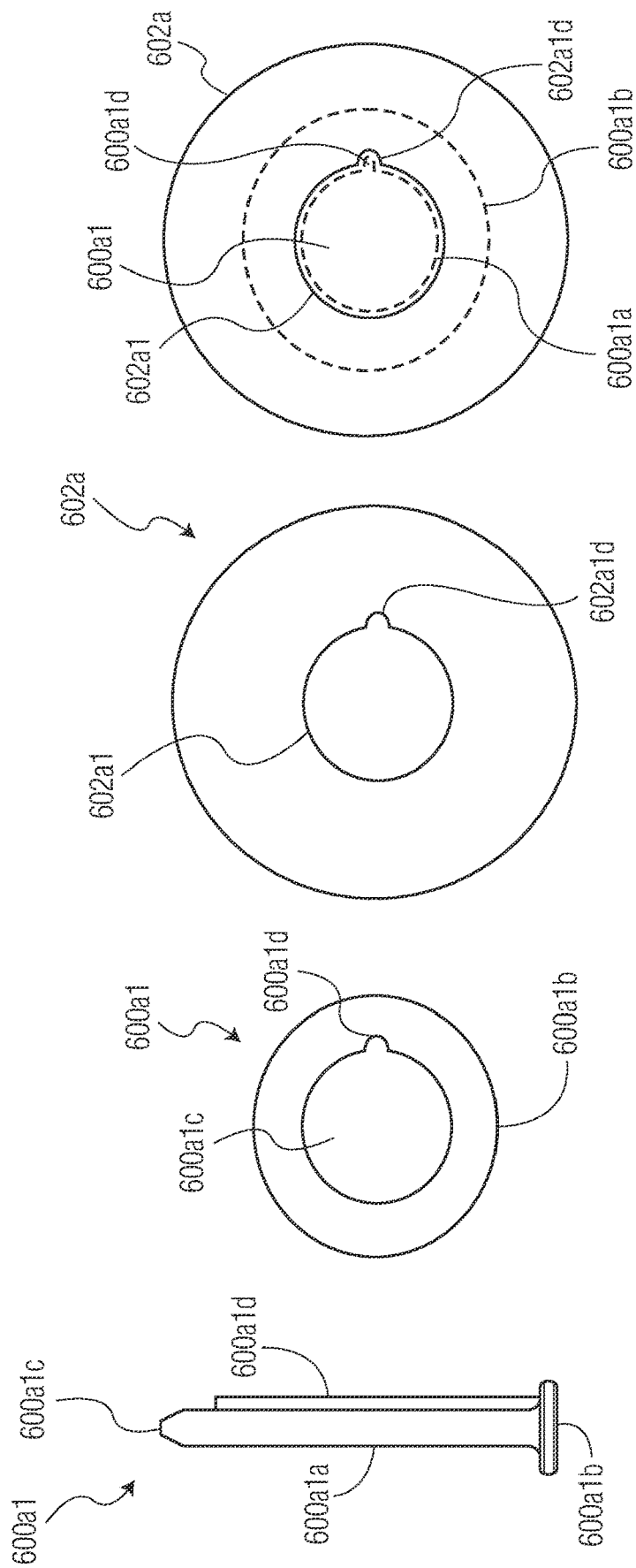

ULTRASONIC WELDING SYSTEMS, METHODS OF USING THE SAME, AND RELATED WORKPIECES INCLUDING WELDED CONDUCTIVE PINS

CROSS REFERENCE TO RELATED APPLICATIONS

This application is a continuation of U.S. patent application Ser. No. 17/333,875, filed May 28, 2021, which claims the benefit of U.S. Provisional Application No. 63/034,345 filed Jun. 3, 2020, the contents of both of which are incorporated herein by reference.

FIELD

The invention relates to the ultrasonic welding, and more particularly, to improved systems and methods for performing ultrasonic welding operations including conductive pin welding.

BACKGROUND

Ultrasonic energy is widely used in forming interconnections between two or more materials. For examples, wire bonding machines (e.g., ball bonding machines, wedge bonding machines, ribbon bonding machines, etc.) are used to bond a wire or ribbon to a bonding location. However, wire bonding utilizes relatively low levels of energy (e.g., bond force, ultrasonic energy, etc.). Exemplary wire bonding machines are marketed by Kulicke and Soffa Industries, Inc. of Fort Washington, Pennsylvania.

Certain applications involve joining of materials other than wire. Welding has been considered for such applications. Ultrasonic welding is also a widely used technology. Ultrasonic welding may use an ultrasonic converter (e.g., carrying a sonotrode) for converting electrical energy into mechanical movement/scrub (e.g., linear movement/scrub, torsional movement/scrub, etc.). However, existing ultrasonic welding technology and equipment is limited in its ability to provide solutions that can satisfy market demand in terms of cost, operational efficiency, flexibility, portability, and related factors.

International Publication No. 2018/187364 (entitled "Ultrasonic Welding Systems and Methods of Using the Same"), assigned to Kulicke and Soffa Industries, Inc., relates to improvements in ultrasonic welding technology, and is incorporated by reference in its entirety.

Still, improvements are needed in connection with applications of ultrasonic welding, including ultrasonic pin welding (where such pins are typically solder and/or press fit into power modules). Thus, it would be desirable to improve ultrasonic welding technology including ultrasonic pin welding.

SUMMARY

According to another exemplary embodiment of the invention, an ultrasonic welding system is provided. The ultrasonic welding system includes a support structure for supporting a workpiece. The ultrasonic welding system also includes a weld head assembly including an ultrasonic converter carrying a sonotrode. The ultrasonic welding system also includes a conductive pin supply configured to provide a plurality of conductive pins for welding using the sonotrode.

According to yet another exemplary embodiment of the invention, a method of operating an ultrasonic welding system is provided. The method includes the steps of: (a) supporting a workpiece on a support structure of the ultrasonic welding system; and (b) welding a conductive pin from a conductive pin supply of the ultrasonic welding system to the workpiece using a sonotrode of a weld head assembly of the ultrasonic welding system, the conductive pin supply including a plurality of the conductive pins.

According to yet another exemplary embodiment of the invention, a workpiece is provided. The workpiece includes: a substrate; and a conductive pin ultrasonically welded to the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 2B is a perspective view of a tip portion of a sonotrode of the ultrasonic welding system of FIG. 2B;

FIG. 2C is a side view of a conductive pin from the conductive pin supply of the ultrasonic welding system of FIG. 2B;

FIGS. 6A-6G are various views of conductive pins and sonotrodes illustrating alignment with keying features in accordance with various exemplary embodiments of the invention.

DETAILED DESCRIPTION

Figure 1:
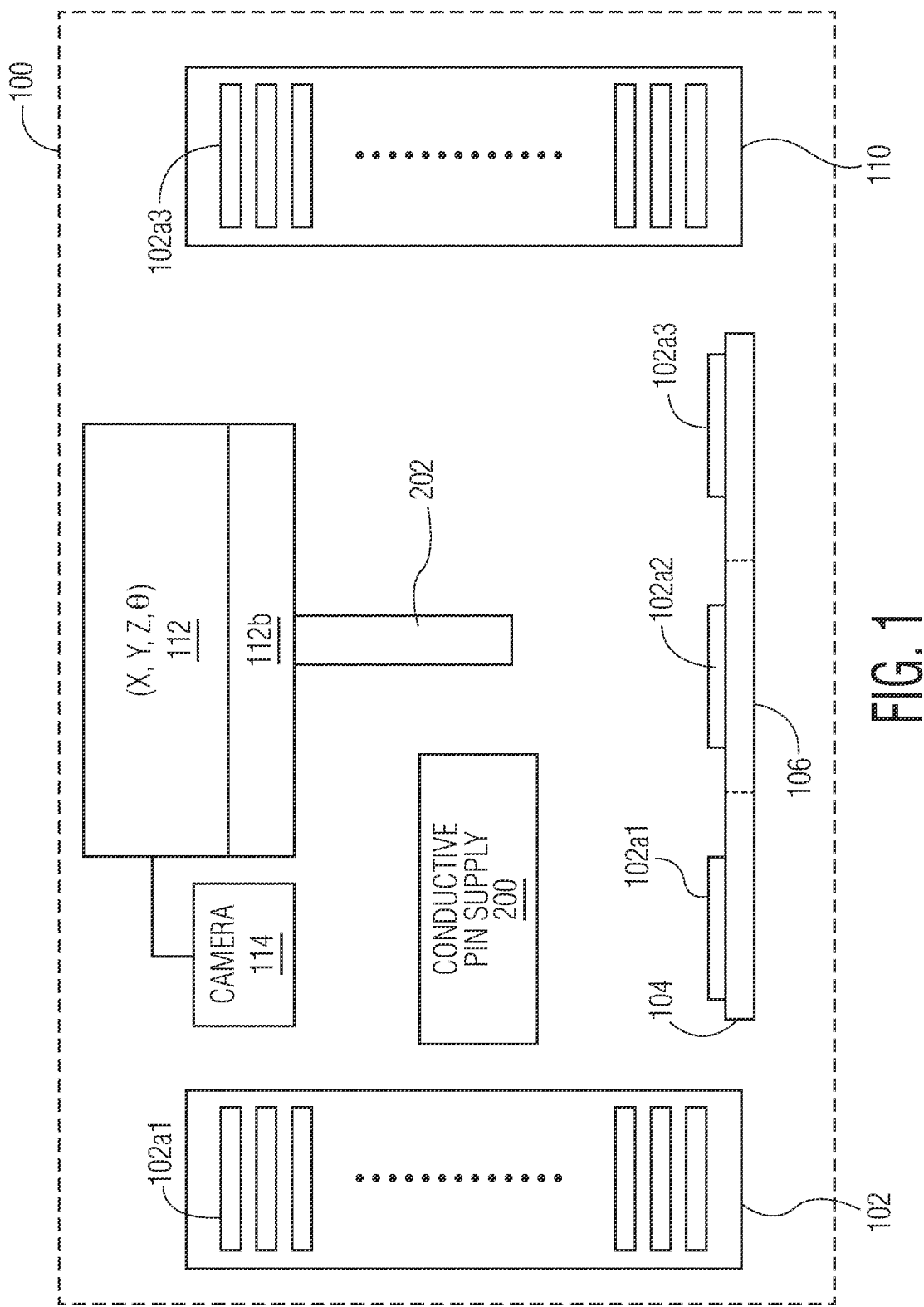
FIG. 1 is a block diagram side view of an ultrasonic welding system in accordance with an exemplary embodiment of the invention.

FIG. 1 illustrates an ultrasonic welding system 100. Ultrasonic welding system 100 includes an input workpiece supply 102 for providing a workpiece 102*a*1, where input workpiece supply 102 is configured to carry a plurality of workpieces 102*a*1 (e.g., workpiece supply 102 may be a carrier such as a magazine handler for carrying a plurality of workpieces 102*a*1, or other supply structure suitable for the application specific workpiece, etc.). Exemplary workpieces 102a1 carried by input workpiece supply 102 include power modules, components of power modules, lead frames, battery modules, etc. Workpieces 102a1 are provided (by any desired transport assembly which may be included in a material handling system 104, such as a gripper assembly) from input workpiece supply 102 to a material handling system 104. Material handling system 104 moves workpiece 102a1 (e.g., using a conveyor assembly, using a gripper assembly, etc.) from input workpiece supply 102 to a support structure 106. Support structure 106 supports the workpiece (now labelled as a clamped workpiece 102a2, when clamped against support structure 106 using a workpiece clamp 108, shown in FIG. 5) during a welding operation. After the welding operation (described below with respect to a weld head assembly 112), a now welded workpiece 102a3 is moved (e.g., using a conveyor assembly, using a gripper assembly, etc.) from a portion of material handling system 104 downstream of support structure 106, to an output workpiece supply 110. Output workpiece supply 110 is configured to receive welded workpieces 102a3 after processing by weld head assembly 112 (where weld head assembly 112 includes an ultrasonic converter 112b carrying a sonotrode 202). Output workpiece supply 110 may be a carrier such as a magazine handler for carrying a plurality of welded workpieces 102a3, or another supply structure suitable for the application specific workpiece.

Ultrasonic welding system 100 includes weld head assembly 112. Weld head assembly includes ultrasonic converter 112b carrying a sonotrode 202, and is moveable along a plurality of substantially horizontal axes. In the example shown in FIG. 1, weld head assembly 112 is configured to move along the x-axis and the y-axis of ultrasonic welding system 100. In the example shown in FIG. 1, weld head assembly 112 is also configured to move along the z-axis of ultrasonic welding system 100, and about a theta axis (Ø-axis) of ultrasonic welding system 100. Not all of these motion axes are required in each application. Using the motion axes of weld head assembly 112, sonotrode 202 is able to be moved into proper welding positions with respect to clamped workpiece 102a2. Camera 114 is also provided (where camera may optionally be carried by weld head assembly 112, or may be carried by another part of ultrasonic welding system 100) for imaging operations related to the alignment between sonotrode 202 and clamped workpiece 102a2, the alignment of the components of clamped workpiece 102a2 in itself, optical inspection of the welds after welding operation, etc.

Various types of workpieces may be welded using ultrasonic welding system 100 (or other systems within the scope of the invention). Exemplary workpieces include a power module, a lead frame and a battery module.

Various types of ultrasonic motion may be imparted on a conductor (e.g., a conductive pin, a signal connector, a conductive terminal, a power terminal, etc.) in accordance with the invention. For example, the sonotrode may be configured to weld a conductor to a workpiece using at least one of linear ultrasonic motion and torsional ultrasonic motion.

Certain of those workpieces are configured to receive a conductive pin. As used herein, the term "conductive pin" is a conductive structure intended to be welded to a workpiece. The conductive pin may have a free end (after being welded to a workpiece), and a body portion of the conductive pin may extend substantially vertically from a "welded" end to the free end. The cross section of the conductive pin may be round, square, rectangular, or have any desired cross section. The term conductive pin shall also be construed to include conductive receptacles or sleeves (e.g., a tubular shape), where the conductive receptacle/sleeve is ultrasonically welded to a workpiece, and configured to receive another conductive element. In accordance with certain exemplary embodiments of the invention, ultrasonic welding system 100 includes a conductive pin supply 200 configured to provide a plurality of conductive pins for welding using sonotrode 202. Exemplary configurations for conductive pin supply include: a grid arrangement (including columns and rows of conductive pins, oriented in such a way for ease of pick up), a bowl feeder, a hopper, a spool, etc. Alternative configurations are contemplated. The conductive pin supply 200 may be configured to operate with a buffer system so that pins are fed through a staging area, ready to be picked up for welding.

Figure 2A:
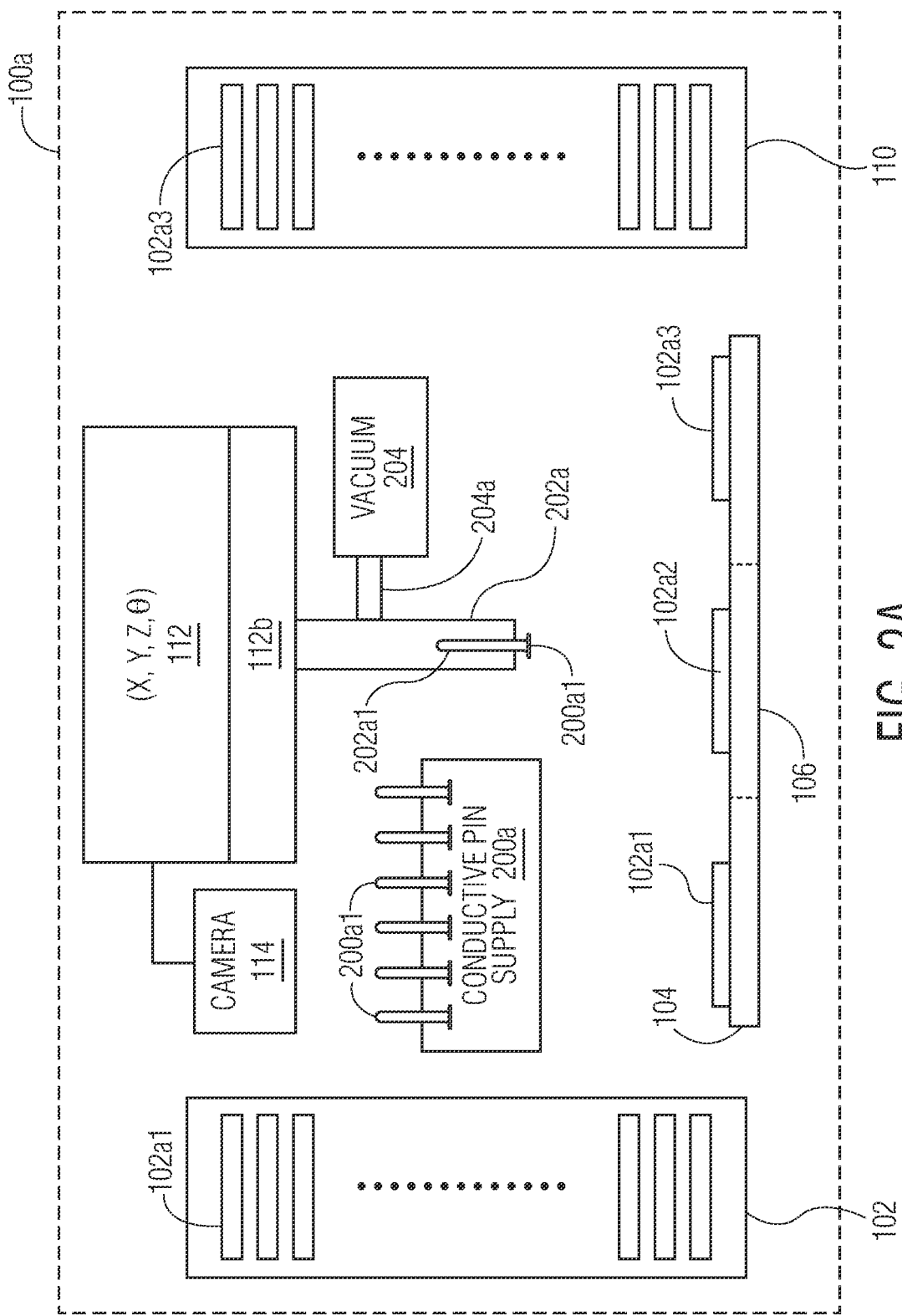
FIG. 2A is a block diagram side view of another ultrasonic welding system in accordance with another exemplary embodiment of the invention.
Figure 3A:
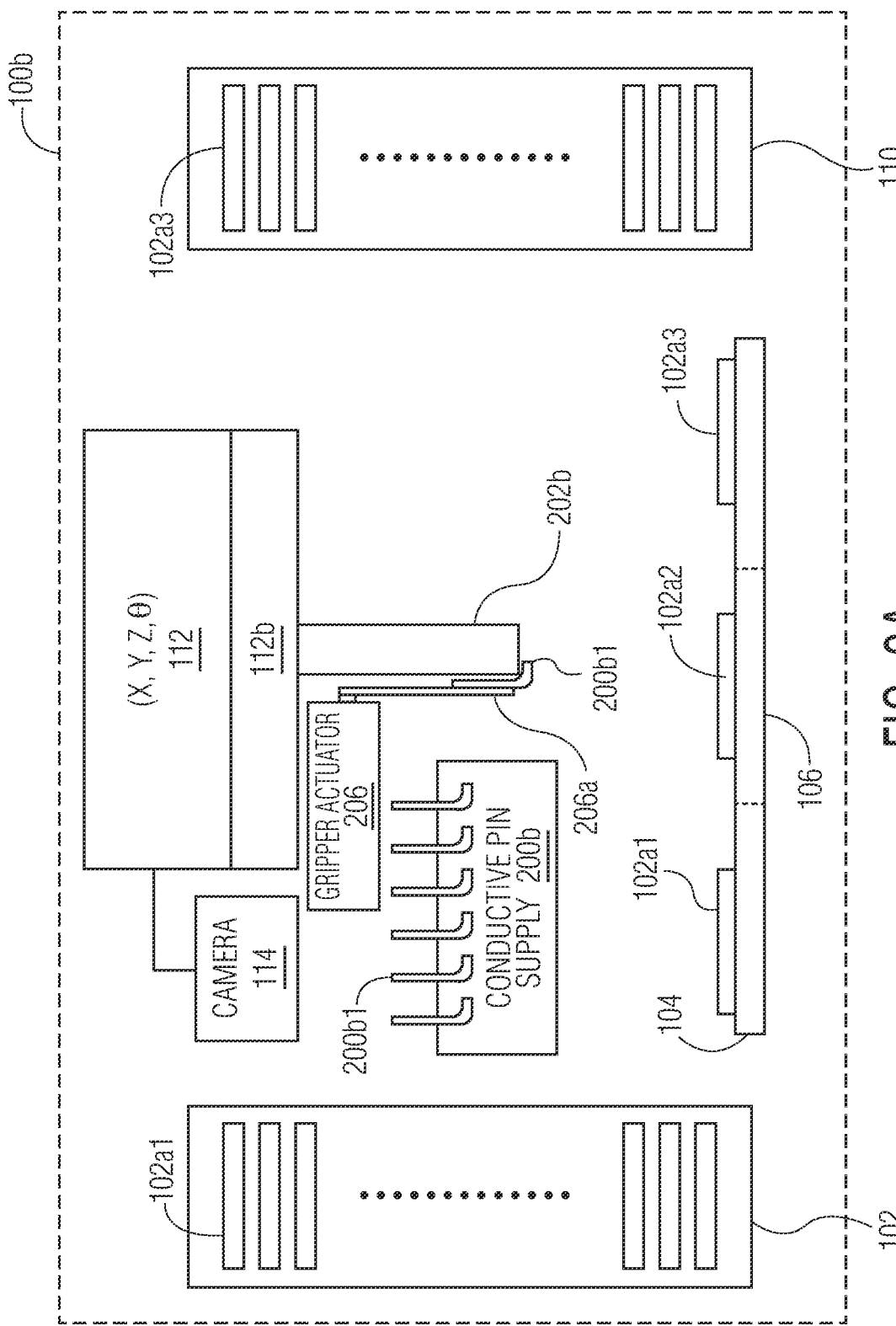
FIG. 3A is a block diagram side view of yet another ultrasonic welding system in accordance with yet another exemplary embodiment of the invention.

Ultrasonic welding system 100, including conductive pin supply 200 and sonotrode 202, may take various forms. More specifically, different configurations of conductive pin supply 200, different configurations of sonotrode 202, etc. are contemplated. FIGS. 2A-2C illustrate an exemplary ultrasonic welding system 100a, including an exemplary configuration of the conductive pin supply (now referred to as conductive pin supply 200a including conductive pins 200a1), and an exemplary configuration of the sonotrode (now referred to as sonotrode 202a defining a vaccum channel 202a1, and coupled to a vacuum source 204 via piping 204a). FIGS. 3A-3C illustrate an exemplary ultrasonic welding system 100b, including another exemplary configuration of the conductive pin supply (now referred to as conductive pin supply 200b including conductive pins 200b1), and an exemplary configuration of the sonotrode (now referred to as sonotrode 202b, adapted to work with a gripper actuator 206 and a gripper arm 206a). FIG. 4 illustrates yet another exemplary ultrasonic welding system 100c, which is substantially similar to ultrasonic welding system 100b (in FIGS. 3A-3C), except that ultrasonic welding system 100c includes a gripper actuator 208, a first gripper arm 208a, and a second gripper arm 208b. Except as described herein, each of ultrasonic welding systems 100a, 100b, and 100c are substantially similar to ultrasonic welding system 100 described above.

Referring specifically, to FIGS. 2A-2C, sonotrode 202a is configured to withdraw a conductive pin 200a1 from conductive pin supply 200a, and weld head assembly 112 is configured to carry (through its various motion axes) the withdrawn conductive pin 200a1 towards clamped workpiece 102a2, and to ultrasonically weld the conductive pin 200a1 to clamped workpiece 102a2. Sonotrode 202a defines a vacuum channel 202a1 connected to vacuum source 204 via piping 204a, for withdrawing the conductive pin 200a1 from the conductive pin supply 200a.

Referring specifically to FIG. 2B, a tip portion 202a3 of sonotrode 202 is shown. Vaccum channel 202a1 is defined by sonotrode 202a. A working surface 202a2 of sontrode 202a is configured to contact a weld portion of a conductive pin and press it against to a workpiece for ultrasonic welding (e.g., see weld portion of conductive pin shown in FIG. 2C). A vacuum hole 202a4 of sonotrode 202a (configured for engagement with piping 204a as shown in FIG. 2A) is also illustrated. FIG. 2C is a side view of conductive pin 200a1 (e.g., a round conductive pin) including a body portion 200a1a, a weld portion 200a1b, and a free end 200a1c. After being welded to a workpiece via weld portion 200a1b, body portion 200a1a may extend substantially vertically from weld portion 200a1b to free end 200a1c. Free end 200a1c (or some other portion of welded conductive pin 200a1) is available for an electrical connection as needed in the given workpiece.

Referring specifically to FIGS. 3A-3C, weld head assembly 112 includes a gripper mechanism configured to withdraw a conductive pin 200b1 from a conductive pin supply 200b. In FIG. 3A, the gripper mechanism includes a gripper actuator 206 and a moveable arm 206a. Through actuation of gripper actuator 206, moveable arm 206a is configured to move between (i) an open position as shown in FIG. 3B for engaging the conductive pin 200b1 and (ii) a closed position as shown in FIG. 3C for holding the conductive pin 200b1 in a position for motion toward the clamped workpiece 102a2. As shown in FIG. 3B, moveable arm 206a aligns the conductive pin 200b1 with the sonotrode 202b in the closed position, holding the conductive pin 200b1 in place with respect to sonotrode 202b. Weld head assembly 112 is configured to carry the withdrawn conductive pin 200b1 towards the workpiece, and to ultrasonically weld the conductive pin 200b1 to the clamped workpiece 102a2.

Referring specifically to FIG. 4, weld head assembly 112 includes another gripper mechanism configured to withdraw a conductive pin 200b1 from the conductive pin supply 200b. In FIG. 4, the gripper mechanism includes a gripper actuator 208, a moveable arm 208a, and a stationary arm 208b. Through actuation of gripper actuator 208, moveable arm 208a is configured to move between (i) an open position for engaging the conductive pin 200b1 and (ii) a closed position for holding the conductive pin 200b1 in a position for motion toward the clamped workpiece 102a2. As shown in FIG. 4, moveable arm 208a moves to secure conductive pin 200b1 in place against the stationary arm 208b in the closed position, thereby aligning the conductive pin 200b1 with sonotrode 202b. Weld head assembly 112 is configured to carry the withdrawn conductive pin 200b1 towards the clamped workpiece 102a2, and to ultrasonically weld the conductive pin 200b1 to the clamped workpiece 102a2.

Figure 3D:
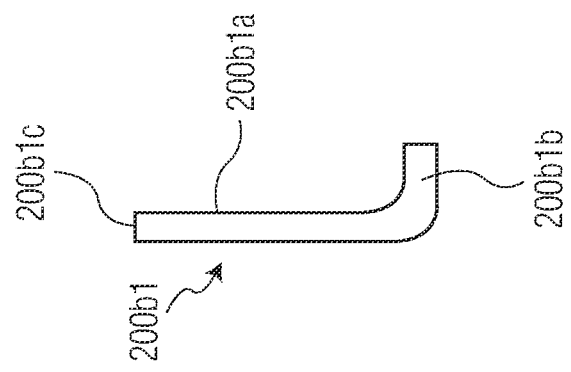
FIG. 3D is a side view of a conductive pin from the conductive pin supply of the ultrasonic welding system of FIG. 3A.
Figure 3C:
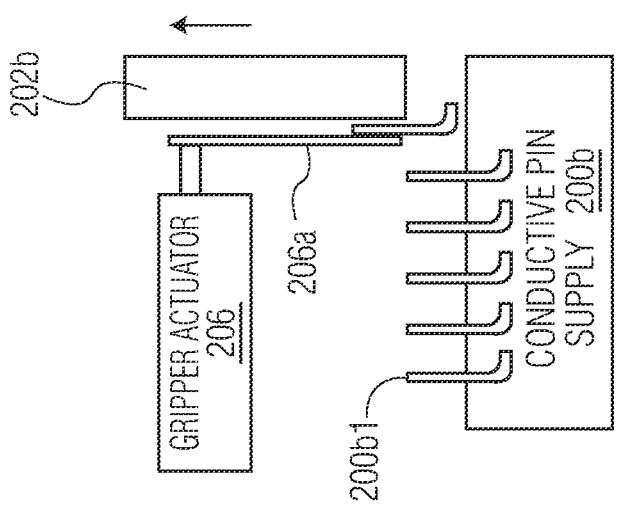
FIGS. 3B-3C are side block diagram views illustrating withdrawal of a conductive pin from a conductive pin supply using the ultrasonic welding system of FIG. 3A.
Figure 3B:
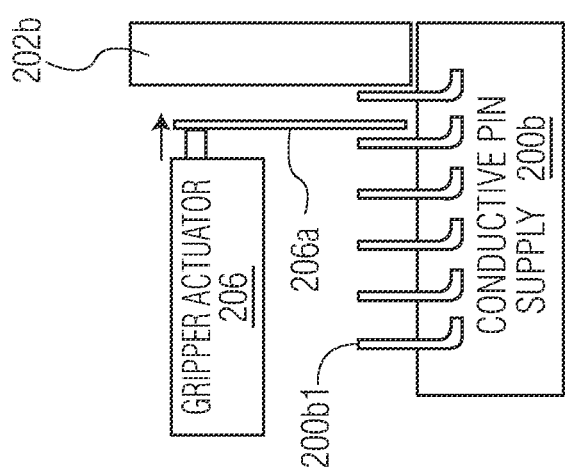
Figure 4:
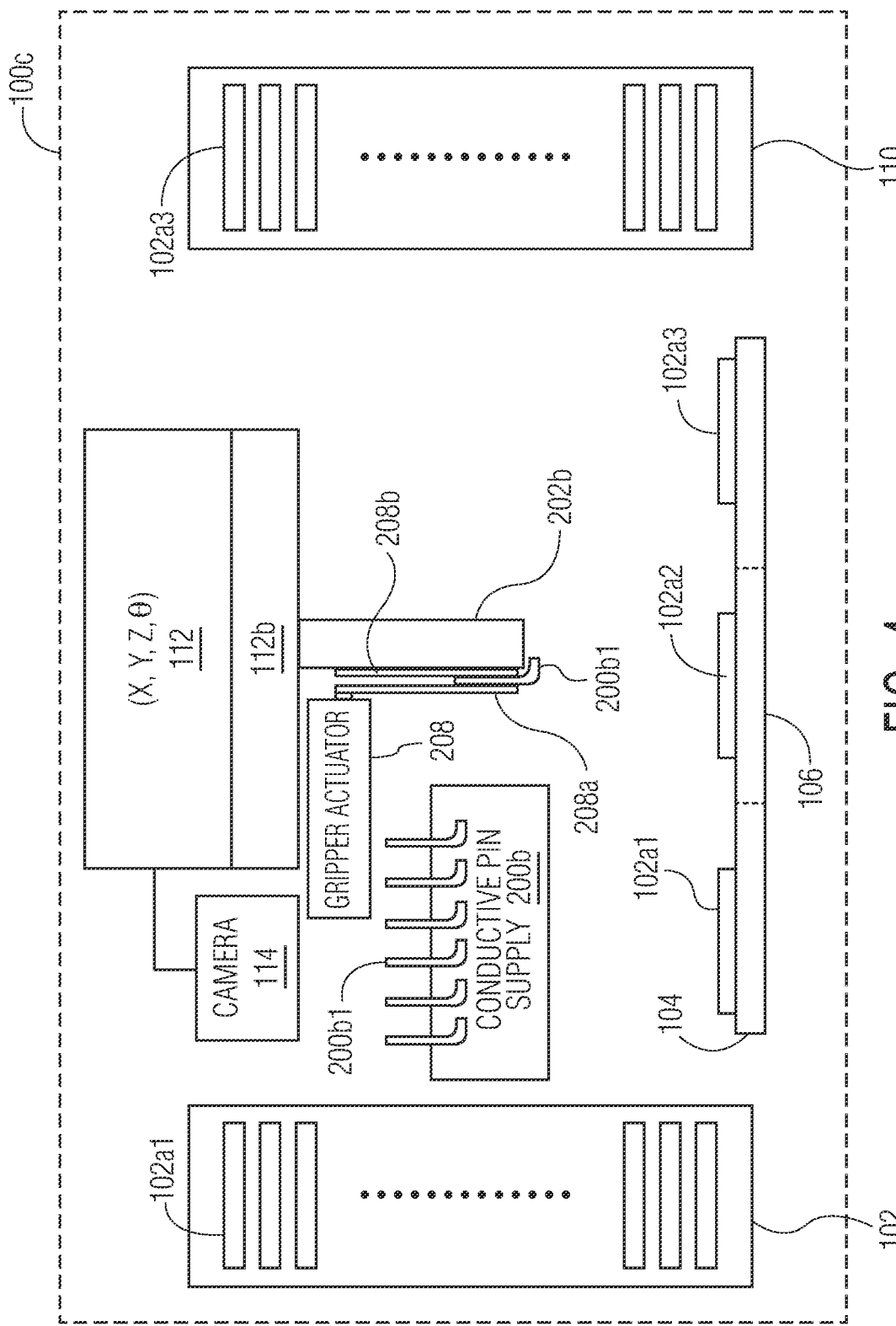
FIG. 4 is a block diagram side view of yet another ultrasonic welding system in accordance with yet another exemplary embodiment of the invention.

Referring specifically conductive pin 200b1 shown in FIGS. 3A-3C and FIG. 4, and detailed in FIG. 3D, conductive pin 200b1 has a different configuration as compared to conductive pin 200a1 from FIGS. 2A-2C. Conductive pin 200b1 includes body portion 200b1a, weld portion 200b1b, and free end 200b1c. After being welded to a workpiece via weld portion 200b1b, body portion 200b1a may extend substantially vertically from weld portion 200b1b to free end 200b1c. Free end 200b1c (or some other portion of welded conductive pin 200b1) is available for an electrical connection as needed in the given workpiece.

It will be appreciated that while aspects of the invention specifically relate to ultrasonic welding systems for welding conductive pins to a workpiece, it is not limited thereto. For example, in accordance with certain exemplary embodiments of the invention, the sonotrode is configured for welding the conductive pin to the workpiece, and for welding other conductors (e.g., a conductive terminal such as a power terminal) to the workpiece. The sonotrode may use a single working area (e.g., such as working surface 202a2 shown in FIG. 2B) to weld both conductive pins and other conductors such as power terminals. However, in other embodiments of the invention, the sonotrode includes a first area configured for contacting the conductive pin for welding to the workpiece, and a second area for contacting a power terminal for welding to the workpiece.

Figure 5:
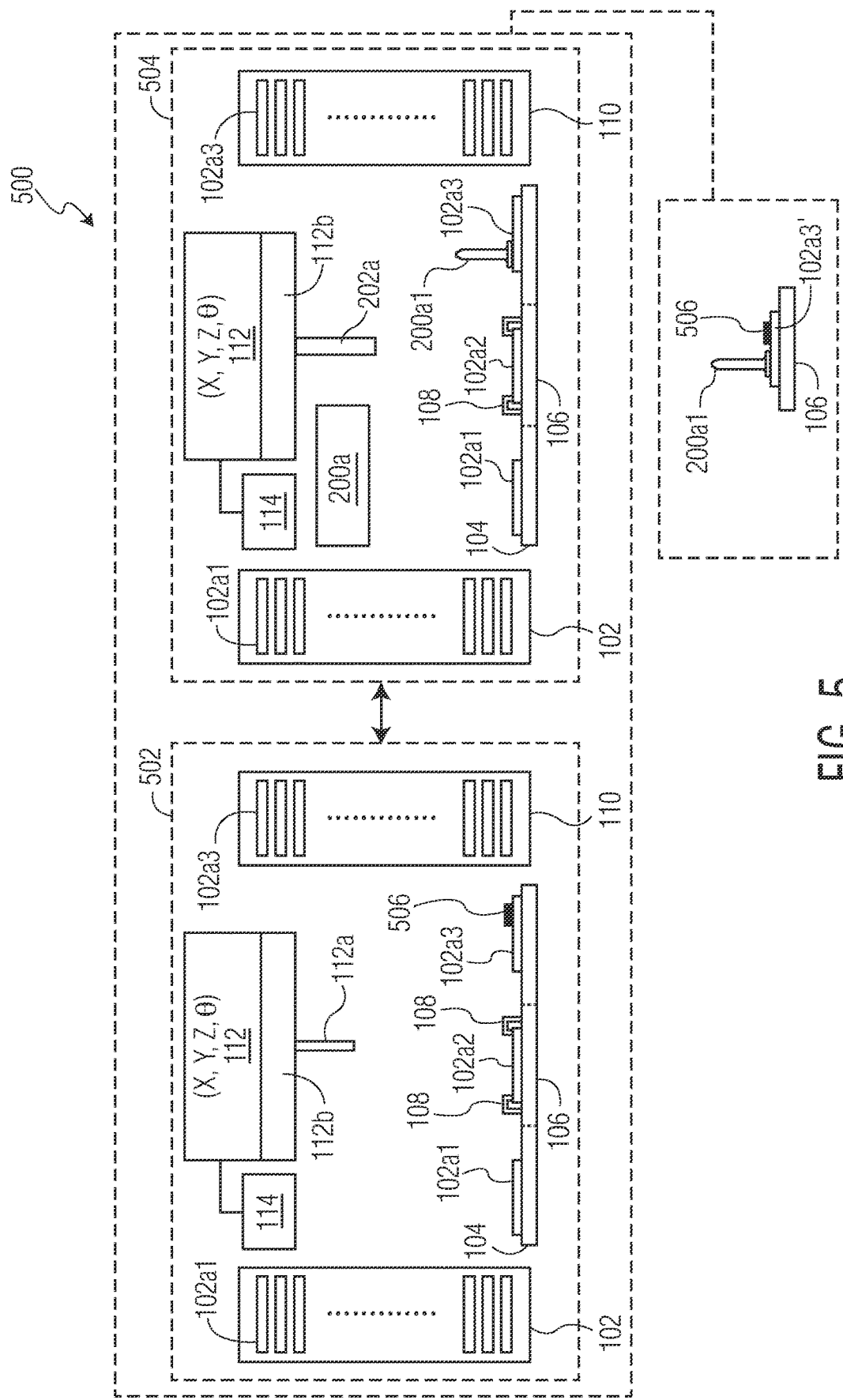
FIG. 5 is a block diagram side view of yet another ultrasonic welding system in accordance with yet another exemplary embodiment of the invention.

In other exemplary embodiments of the invention, the ultrasonic welding system includes a second weld head assembly having a second ultrasonic converter carrying a second sonotrode, the second weld head assembly configured for welding power terminals to the workpiece. Referring specifically to FIG. 5, an ultrasonic welding system 500 is shown. Ultrasonic welding system 500 includes a first ultrasonic welding subsystem 502 (which may be substantially similar to ultrasonic welding system 100 shown in FIG. 1 of International Publication No. 2018/187364, and is also similar to welding systems disclosed herein except that first ultrasonic welding subsystem 502 includes a sonotrode 112a and does not include a conductive pin supply) and a second ultrasonic welding subsystem 504. Second ultrasonic welding subsystem 504 may be, for example, ultrasonic welding system 100 shown in FIG. 1, ultrasonic welding system 100a shown in FIG. 2A, ultrasonic welding system 100b shown in FIG. 3A, ultrasonic welding system 100c shown in FIG. 4, among others. First ultrasonic welding subsystem 502 is configured to weld certain conductors (e.g., larger power conductors such as power terminals 506), while second ultrasonic welding subsystem 504 is configured to weld conductive pins as herein. FIG. 5 shows an example of an output workpiece 102a3' of ultrasonic welding system 500. Output workpiece 102a3' includes a substrate (not labelled), a conductive terminal 506 ultrasonically welded to the substrate, and a conductive pin 200a1 ultrasonically welded to the substrate. For example, workpiece 102a3' may be a power semiconductor module where conductive terminal 506 is a power terminal of the power semiconductor module, and where conductive pin 200a1 is a signal connection of the power semiconductor module.

While FIG. 5 illustrates a conductive pin supply 200a including conductive pins 200a1 (i.e., similar to the configuration in FIG. 2A), the inventive features of ultrasonic welding system 500 (including ultrasonic welding system 504) may be applied to any type of conductive pins within the scope of the invention (e.g., conductive pin 200b1 shown in FIG. 3A), along with corresponding changes to the weld head assembly.

According to certain exemplary embodiments of the invention, during the welding operations, exemplary technical specifications include: (i) the sonotrode being configured to operate at a bond force of between 5-500 kg, or the sonotrode being configured to operate at a bond force of between 5-300 kg, or the sonotrode being configured to operate at a bond force of between 5-100 kg; (ii) the sonotrode tip motion amplitude being between 5-150 microns, or the sonotrode tip motion amplitude being between 5-120 microns, or the sonotrode tip motion amplitude being between 5-100 microns; (iii) the sonotrode being configured to form an ultrasonic weld between a first portion of a workpiece and a second portion of a workpiece having an area in a range between 1.5-30 mm$^2$; or the sonotrode being configured to form an ultrasonic weld between a first portion of a workpiece and a second portion of a workpiece having an area in a range between 1.5-20 mm$^2$; or the sonotrode being configured to form an ultrasonic weld between a first portion of a workpiece and a second portion of a workpiece having an area in a range between 1.5-16 mm$^2$; and (iv) the sonotrode being configured to operate at a frequency in a range between 15-40 kHz, or the sonotrode being configured to operate at a frequency in a range between 20-35 kHz, or the sonotrode being configured to operate at a frequency in a range between 20-30 kHz. Exemplary thicknesses of the conductive contact of the contact element (the part of the workpiece being contacted by the sonotrode) include: between 0.2-3 mm; 0.2-1.5 mm, and 0.2-1.2 mm.

Variations within the scope of the invention are contemplated, even if not illustrated. For example, in accordance with certain exemplary embodiments of the invention, the weld head assembly may define a keying feature configured to align with a corresponding keying feature of the conductive pins such that a conductive pin held by the weld head assembly is properly aligned with respect to the sonotrode. FIGS. 6A-6D and FIGS. 6E-6G illustrate examples of such embodiments of the invention. The conductive pins and sonotrodes of FIGS. 6A-6D and FIGS. 6E-6G may be implemented in connection with any of the ultrasonic welding systems disclosed herein (e.g., ultrasonic welding systems 100, 100a, 100b, 100c, 504, and 700), or any other ultrasonic welding system within the scope of the invention.

FIGS. 6A and 6B are, respectively, side and top views of a conductive pin 600a1 (e.g., a round conductive pin) including a body portion 600a1a, a weld portion 600a1b, a free end 600a1c, and a keying feature 600a1d. Keying feature 600a1d of conductive pin 600a1 may be used to align with a corresponding keying feature of weld head assembly (e.g., a keyway) such that conductive pin 600a1 held by weld head assembly is properly aligned with respect to sonotrode 602a. After being welded to a workpiece via weld portion 600a1b, body portion 600a1a may extend substantially vertically from weld portion 600a1b to free end 600a1c. Free end 600a1c (or some other portion of welded conductive pin 600a1) is available for an electrical connection as needed in the given workpiece. FIG. 6C is an end view of sonotrode 602a, including a vacuum channel 602a1 defined by sonotrode 602a. At vacuum channel 602a1, sonotode 602a defines a keying feature 602a1d (e.g., a recess). When conductive pin 600a1 is engaged with sonotrode 602a, keying feature 600a1d engages with keying feature 602a1d. FIG. 6D shows conductive pin 600a1 aligned with respect to sonotrode 602a of a weld head assembly (not shown, but see weld head assembly 112 throughout the various drawings).

Figure 6G:
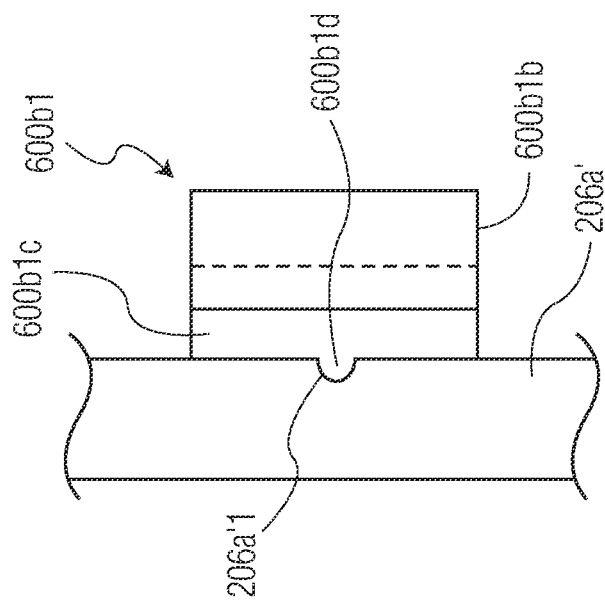
Figure 6F:
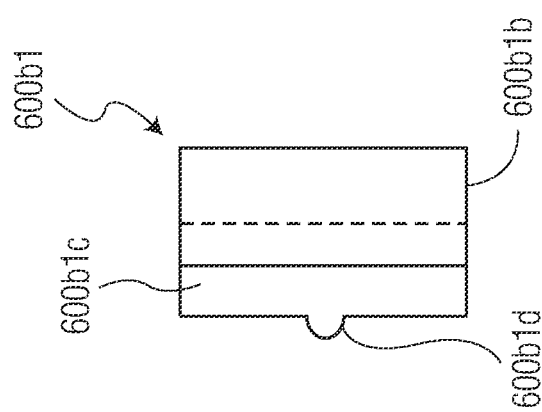
Figure 6E:
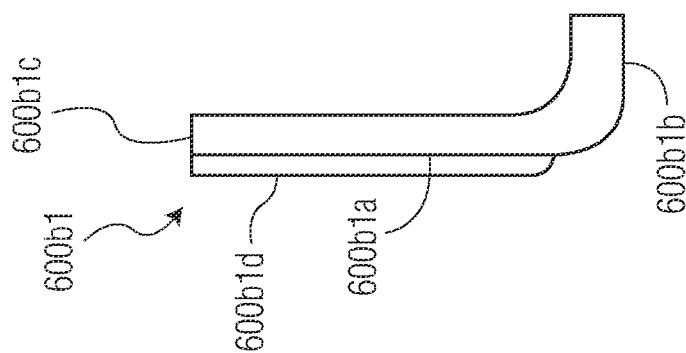

FIGS. 6E and 6F are, respectively, side and top views of a conductive pin 600b1 (e.g., a conductive pin having an "L" shape) including a body portion 600b1a, a weld portion 600b1b, a free end 600b1c, and a keying feature 600b1d (e.g., a protrusion). Keying feature 600b1d of conductive pin 600b1 may be used to align with a corresponding keying feature (e.g., a keyway) of gripper arm 206a' (similar to gripper arm 206a of FIGS. 3A-3C) such that conductive pin 600b1 is held in place by gripper arm 206a' of weld head assembly, thereby aligning conductive pin 600b1 with respect to sonotrode 602a. After being welded to a workpiece via weld portion 600b1b, body portion 600b1a may extend substantially vertically from weld portion 600b1b to free end 600b1c. Free end 600b1c (or some other portion of welded conductive pin 600b1) is available for an electrical connection as needed in the given workpiece. FIG. 6G is a top view of gripper arm 206a' engaged with conductive pin 600b1. Gripper arm 206a' defines a keying feature 206a'1 (i.e., a recess). When conductive pin 600b2 is engaged with gripper arm 206a', keying feature 206a'1 engages with keying feature 602b1d.

The keying features illustrated and described in connection with FIG. 6A-6G are exemplary in nature; alternative keying features or alignment features are contemplated within the scope of the invention. For example, keying feature 600a1d protrudes from body portion 600a1a of conductive pin 600a1; however, a recessed keying feature may be utilized in connection with such a conductive pin, where a mating keying feature of a sonotrode (or other portion of a bond head assembly) may be a protruding feature.

Further, in accordance with certain exemplary embodiments of the invention, the sonotrode (or other aspect of the weld head assembly such as a gripper mechanism) may not act as a pick tool. Rather, the ultrasonic welding system may further include a pick tool configured to withdraw a conductive pin from the conductive pin supply, where the withdrawn conductive pin is transferred to the weld head assembly for welding to the workpiece.

Figure 7:
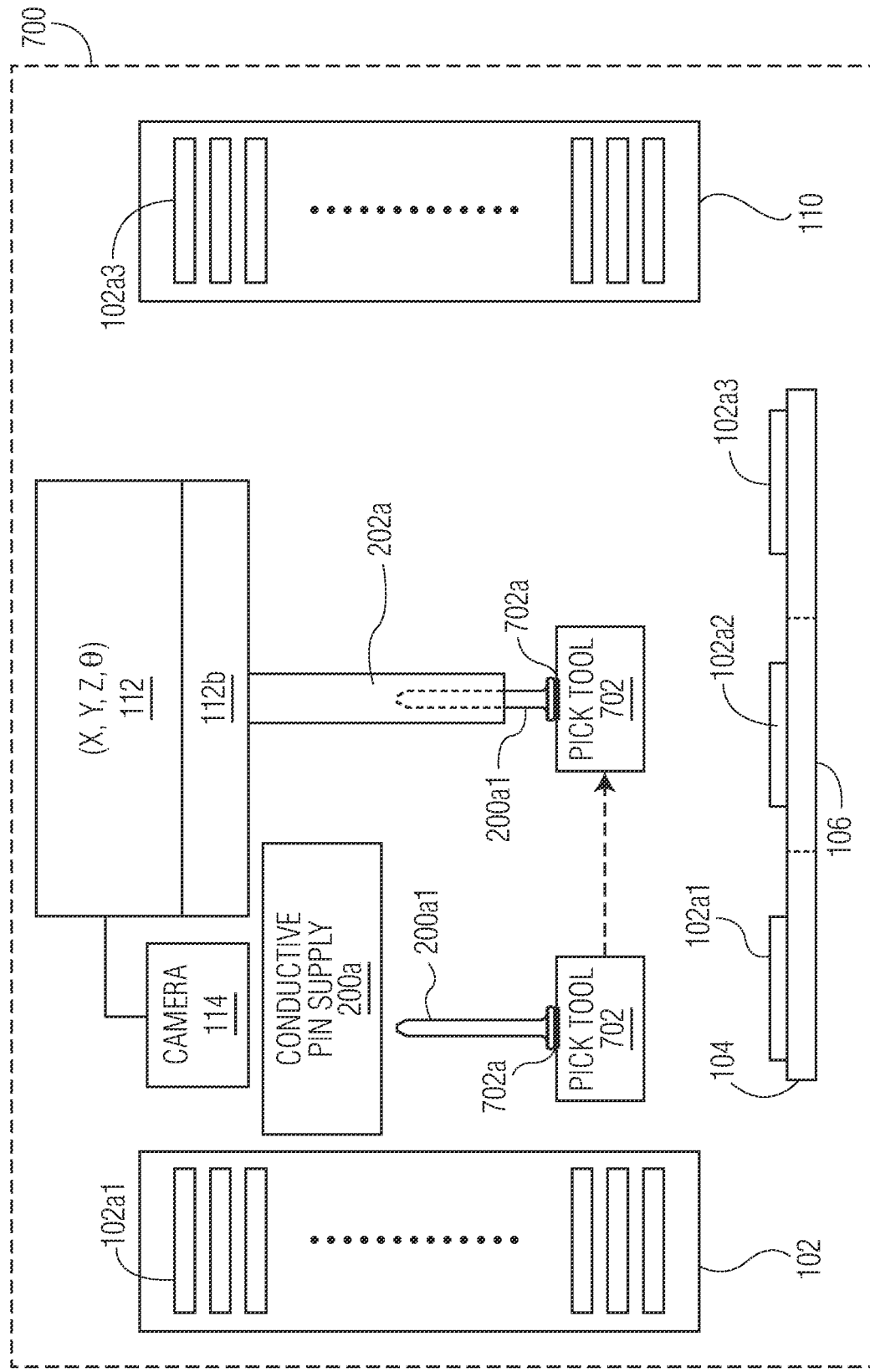
FIG. 7. is a block diagram side view of an ultrasonic welding system in accordance with an exemplary embodiment of the invention.

Referring specifically to FIG. 7, ultrasonic welding system 700 is shown. Ultrasonic welding system 700 (which is similar to the previously detailed ultrasonic welding systems described herein) includes a pick tool 702. Pick tool 702 includes a contact portion 702a. In accordance with certain exemplary embodiments of the invention, pick tool 702 withdraws (or otherwise receives) conductive pin 200a1 from conductive pin supply 200a. The conductive pin 200a1 is transferred to weld head assembly 112 for welding to workpiece 102a2. Contact portion 702a may have a number of different alternative configurations for picking conductive pin 200a1 from conductive pin supply 200a, and engaging in transferring conductive pin 200a1 to sonotrode 202a of weld head assembly 112. Exemplary configurations of contact portion 702a include: a magnetic holding mechanism; a mechanical gripping mechanism; a vacuum based holding mechanism; among others.

Referring again to FIG. 7, once pick tool 702 holds a conductive pin 200a1, pick tool 702 may move toward sonotrode 202a for transfer of the conductive pin 200a1 (see dotted line portion of conductive pin 200a1 engaged with sonotrode 202a). Alternatively, sonotrode 202a (carried by weld head assembly 112) may be moved toward pick tool 702 for transfer of the conductive pin 200a1. In yet another alternative, both pick tool 702 and sonotrode 202a may be moved towards one another for transfer of the conductive pin 200a1. While FIG. 7 illustrates a conductive pin supply 200a including conductive pins 200a1 (i.e., similar to the configuration in FIG. 2A), the inventive features of ultrasonic welding system 700 may be applied to any type of conductive pins within the scope of the invention (e.g., conductive pin 200b1 shown in FIG. 3A), along with corresponding changes to the weld head assembly.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultrasonic welding system comprising:
    a support structure configured for supporting a workpiece;
    a weld head assembly including an ultrasonic converter carrying a sonotrode; and
    a conductive pin supply configured to provide a plurality of conductive pins for welding using the sonotrode,
    wherein the sonotrode of the weld head assembly is configured to withdraw a conductive pin from the conductive pin supply, and the weld head assembly is configured to carry the withdrawn conductive pin towards the workpiece, and to ultrasonically weld the conductive pin to the workpiece, wherein the sonotrode defines a vacuum channel for withdrawing the conductive pin from the conductive pin supply.

2. The ultrasonic welding system of claim 1 wherein the weld head assembly is configured to move along a plurality of distinct motion axes.

3. The ultrasonic welding system of claim 2 wherein the plurality of distinct motion axes includes an x-axis, a y-axis, and a z-axis.

4. The ultrasonic welding system of claim 2 wherein the plurality of distinct motion axes includes a theta axis.

5. The ultrasonic welding system of claim 1 wherein the weld head assembly defines a keying feature configured to align with a corresponding feature of the conductive pins such that the conductive pin held by the weld head assembly is properly aligned with respect to the sonotrode.

6. The ultrasonic welding system of claim 1 wherein the sonotrode is configured for welding the conductive pin to the workpiece, and for welding a power terminal to the workpiece.

7. The ultrasonic welding system of claim 1 wherein the sonotrode includes a first area configured for contacting the conductive pin for welding to the workpiece, and a second area for contacting a power terminal for welding to the workpiece.

8. The ultrasonic welding system of claim 1 further comprising a second weld head assembly including a second ultrasonic converter carrying a second sonotrode, the second weld head assembly configured for welding power terminals to the workpiece.

9. A method of operating an ultrasonic welding system, the method comprising the steps of:
   supporting a workpiece on a support structure of the ultrasonic welding system;
   withdrawing a conductive pin from a conductive pin supply using a sonotrode of a weld head assembly of the ultrasonic welding system, the sonotrode defining a vacuum channel for withdrawing the conductive pin from the conductive pin supply, the conductive pin supply including a plurality of the conductive pins;
   carrying the withdrawn conductive pin towards the workpiece using the weld head assembly; and
   welding the conductive pin from the conductive pin supply of the ultrasonic welding system to the workpiece using the sonotrode of the weld head assembly of the ultrasonic welding system.

10. The method of claim 9 wherein the weld head assembly is configured to move along a plurality of distinct motion axes of the ultrasonic welding system.

11. The method of claim 10 wherein the plurality of distinct motion axes includes an x-axis, a y-axis, and a z-axis.

12. The method of claim 10 wherein the plurality of distinct motion axes includes a theta axis.

13. The method of claim 9 wherein the weld head assembly defines a keying feature configured to align with a corresponding feature of the conductive pins such that the conductive pin held by the weld head assembly is properly aligned with respect to the sonotrode.

14. The method of claim 9 further comprising the step of welding a power terminal to the workpiece using the sonotrode.

15. The method of claim 14 wherein the sonotrode includes a first area configured for contacting the conductive pin for welding to the workpiece, and a second area for contacting the power terminal for welding to the workpiece.

16. The method of claim 9 wherein the ultrasonic welding system includes a second weld head assembly including a second ultrasonic converter carrying a second sonotrode, the method further comprising the step of welding a power terminal to the workpiece using the second sonotrode.

* * * * *